United States Patent
Jenkins

(10) Patent No.: US 11,131,706 B2
(45) Date of Patent: Sep. 28, 2021

(54) DEGRADATION MONITORING OF SEMICONDUCTOR CHIPS

(71) Applicant: International Business Machines Corporation, Armonk, NY (US)

(72) Inventor: Keith A. Jenkins, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 1202 days.

(21) Appl. No.: 14/962,043

(22) Filed: Dec. 8, 2015

(65) Prior Publication Data

US 2017/0160339 A1   Jun. 8, 2017

(51) Int. Cl.
| | |
|---|---|
| *G01R 31/28* | (2006.01) |
| *G06F 30/3312* | (2020.01) |
| *G01R 31/3193* | (2006.01) |
| *G01R 31/3177* | (2006.01) |
| *G01R 31/317* | (2006.01) |
| *G01R 31/30* | (2006.01) |

(52) U.S. Cl.
CPC ..... *G01R 31/2882* (2013.01); *G01R 31/3177* (2013.01); *G01R 31/31725* (2013.01); *G01R 31/31937* (2013.01); *G06F 30/3312* (2020.01); *G01R 31/30* (2013.01)

(58) Field of Classification Search
None
See application file for complete search history.

(56) References Cited

U.S. PATENT DOCUMENTS

| | | | | | |
|---|---|---|---|---|---|
| 4,293,919 | A | * | 10/1981 | Dasgupta ....... | G01R 31/318583 326/16 |
| 4,564,943 | A | * | 1/1986 | Collins ............. | G01R 31/2834 714/745 |
| 4,924,430 | A | * | 5/1990 | Zasio .................. | G06F 17/5031 716/108 |
| 5,043,990 | A | * | 8/1991 | Doi ......................... | G06F 11/10 714/48 |
| 5,455,931 | A | * | 10/1995 | Camporese .............. | G06F 1/10 713/501 |

(Continued)

FOREIGN PATENT DOCUMENTS

| | | |
|---|---|---|
| EP | 2060924 A1 | 5/2009 |
| JP | 2009074921 A * | 4/2009 |
| JP | 2012128712 A * | 7/2012 |

OTHER PUBLICATIONS

Machine Translation for JP2012128712 (Year: 2012).*

(Continued)

*Primary Examiner* — Catherine T. Rastovski
*Assistant Examiner* — Leonard S Liang
(74) *Attorney, Agent, or Firm* — Robert J. Shatto

(57) ABSTRACT

A computer system may determine a first set of output values for a set of test paths at a first time. Each output value may correspond to a test path in the set of test paths. The computer system may then determine a second set of output values at a second time. Each output value in the second set of output values may have an associated output value in the first set of output values. The computer system may then determine whether degradation of the semiconductor chip has occurred by comparing the first set of output values to the second set of output values.

16 Claims, 8 Drawing Sheets

(56) References Cited

U.S. PATENT DOCUMENTS

| | | | | |
|---|---|---|---|---|
| 5,787,092 | A * | 7/1998 | Jaynes | G01R 31/3016 714/724 |
| 5,923,676 | A * | 7/1999 | Sunter | G01R 31/31858 714/733 |
| 7,373,572 | B2 * | 5/2008 | Mak | G01R 31/318583 327/202 |
| 7,471,161 | B2 * | 12/2008 | Liu | G01R 31/2856 331/44 |
| 7,977,965 | B1 * | 7/2011 | Fleischer | H03K 3/0375 326/12 |
| 8,653,844 | B2 * | 2/2014 | Sadoughi | H01L 22/22 324/750.3 |
| 8,847,604 | B2 * | 9/2014 | Baumann | G01R 31/3181 324/537 |
| 9,157,959 | B2 | 10/2015 | Ishimi | |
| 9,229,051 | B2 * | 1/2016 | Sharma | G01R 31/3016 |
| 9,310,426 | B2 * | 4/2016 | Anemikos | G01R 31/2856 |
| 9,329,229 | B2 * | 5/2016 | Abadir | G01R 31/2882 |
| 9,536,038 | B1 * | 1/2017 | Quinton | G06F 17/5081 |
| 9,536,625 | B1 * | 1/2017 | Quinton | G11C 29/023 |
| 9,823,297 | B2 * | 11/2017 | Jung | G01R 31/2882 |
| 10,048,316 | B1 * | 8/2018 | Coutts | G06F 1/08 |
| 10,083,759 | B2 * | 9/2018 | Nakamura | G11C 29/023 |
| 2002/0044053 | A1 * | 4/2002 | Seki | G01R 31/31715 340/527 |
| 2003/0054577 | A1 * | 3/2003 | Yonezawa | H01L 22/20 438/14 |
| 2003/0083840 | A1 * | 5/2003 | Corr | G01R 31/3016 702/117 |
| 2003/0128064 | A1 * | 7/2003 | Mikami | G01R 31/31937 327/276 |
| 2004/0268280 | A1 * | 12/2004 | Eleyan | G01R 31/3016 714/30 |
| 2005/0134394 | A1 * | 6/2005 | Liu | G01R 31/31703 331/57 |
| 2005/0154552 | A1 * | 7/2005 | Stroud | G01R 31/2882 702/120 |
| 2005/0193296 | A1 * | 9/2005 | Chien | G01R 31/31723 714/724 |
| 2005/0229060 | A1 * | 10/2005 | Cochran | G11C 29/14 714/733 |
| 2005/0271131 | A1 * | 12/2005 | Hafed | G01R 31/31709 375/224 |
| 2006/0119397 | A1 * | 6/2006 | Ferraiolo | G01R 31/31725 327/31 |
| 2006/0242474 | A1 * | 10/2006 | Jun | G06F 1/06 714/700 |
| 2007/0075792 | A1 * | 4/2007 | Liu | G01R 31/2856 331/57 |
| 2008/0048750 | A1 * | 2/2008 | Fujita | G01R 31/3016 327/276 |
| 2008/0084228 | A1 | 4/2008 | Liu et al. | |
| 2008/0104561 | A1 * | 5/2008 | Carpenter | G06F 17/5031 716/104 |
| 2008/0218198 | A1 * | 9/2008 | Yasuda | G01R 31/3004 326/16 |
| 2009/0044054 | A1 * | 2/2009 | Bueti | G06F 11/1608 714/26 |
| 2009/0044160 | A1 * | 2/2009 | Bueti | G06F 17/5081 716/113 |
| 2009/0063061 | A1 | 3/2009 | Bolam et al. | |
| 2009/0189634 | A1 * | 7/2009 | Rezgui | H03K 19/00392 326/12 |
| 2010/0194400 | A1 * | 8/2010 | Baumann | G01R 31/3016 324/537 |
| 2010/0299096 | A1 * | 11/2010 | Ishida | G01R 31/31725 702/117 |
| 2011/0050270 | A1 * | 3/2011 | Miyazaki | G01R 31/2621 324/762.01 |
| 2011/0154141 | A1 * | 6/2011 | Gillis | G01R 31/31725 714/731 |
| 2012/0153965 | A1 * | 6/2012 | Huang | G01R 31/028 324/548 |
| 2012/0249170 | A1 | 10/2012 | Baumann et al. | |
| 2013/0002274 | A1 * | 1/2013 | Saneyoshi | G01R 31/2849 324/750.01 |
| 2013/0086444 | A1 * | 4/2013 | Liu | G06F 11/08 714/752 |
| 2013/0124133 | A1 * | 5/2013 | Anemikos | G01R 31/31718 702/120 |
| 2013/0260485 | A1 * | 10/2013 | van der Wagt | G01R 31/3191 438/17 |
| 2013/0271148 | A1 * | 10/2013 | Maeda | B60L 3/0046 324/426 |
| 2013/0285685 | A1 | 10/2013 | Bowman et al. | |
| 2013/0314102 | A1 * | 11/2013 | Franzon | G01R 31/31725 324/612 |
| 2014/0040692 | A1 * | 2/2014 | Shah | G06F 11/24 714/736 |
| 2014/0132293 | A1 | 5/2014 | Abadir et al. | |
| 2014/0132315 | A1 * | 5/2014 | Sharma | G01R 31/2884 327/142 |
| 2014/0176116 | A1 * | 6/2014 | Kumar | G01R 31/2858 324/76.41 |
| 2014/0218060 | A1 | 8/2014 | Saneyoshi | |
| 2015/0219713 | A1 * | 8/2015 | Aoyama | G01R 31/2801 324/763.01 |
| 2015/0247892 | A1 | 9/2015 | Robertazzi et al. | |
| 2016/0140272 | A1 * | 5/2016 | Mohan | G06F 30/3312 716/108 |
| 2016/0209467 | A1 * | 7/2016 | Balakrishnan | G01R 31/31726 |
| 2016/0216315 | A1 * | 7/2016 | Jung | G01R 31/2882 |
| 2017/0016955 | A1 * | 1/2017 | Kim | G01R 31/3177 |
| 2017/0146592 | A1 * | 5/2017 | Freeman | G01R 31/2884 |

OTHER PUBLICATIONS

Asadi, Hossein; Tahoori, Mehdi; "Soft Error Derating Computation in Sequential Circuits"; ICCAS '06, Nov. 5-9, 2006, San Jose, CA. (Year: 2006).*

Fazeli, Mahdi; Ahmadian, Seyed; Miremadi, Seyed; Asadi, Hossein, Tahoori, Mehdi; Soft Error Rate Estimation of Digital Circuits in the Presence of Multiple Event Transients (METs); 978-3-9810801-7-9/DATE11/2011 EDAA (Year: 2011).*

Chen et al., "A TDC-based test platform for dynamic circuit aging characterization," 2011 IEEE International Reliability Physics Symposium (IRPS), Apr. 10-14, 2011, pp. 2B.2.1-2B.2.5, Monterey, CA, © Copyright 2015 IEEE DOI: 10.1109/IRPS.2011.5784448.

Lu et al., "A built-in BTI monitor for long-term data collection in IBM microprocessors," 2013 IEEE International Reliability Physics Symposium (IRPS), Apr. 14-18, 2013, pp. 4A.1.1-4A.1.6, Anaheim, CA, © Copyright 2015 IEEE DOI: 10.1109/IRPS.2013.6532003.

Wang et al., "A Novel Architecture for On-Chip Path Delay Measurement," IEEE International Test Conference, Nov. 1-6, 2009, pp. 1-10, Austin, TX, © Copyright 2009 IEEE DOI: 10.1109/TEST.2009.5355742.

* cited by examiner

DEGRADATION MONITORING OF SEMICONDUCTOR CHIPS

BACKGROUND

The present disclosure relates generally to the field of computer hardware, and more particularly to monitoring the health of semiconductor chips.

Semiconductor devices (e.g., CMOS devices) often degrade over time as they are used. The primary mechanisms by which CMOS devices degrade are bias-temperature instability (BTI) and hot-carrier injection (HCI). BTI may be caused by the creation of interface traps and oxide charge due to a negative gate bias and/or elevated temperatures. HCI is a phenomenon in solid-state devices (such as CMOS transistors) where an electron or an electron hole gains enough kinetic energy to break an interface state. Ring oscillator circuits may be used to detect degradation of a CMOS device, but they are subjected primarily to BTI degradation, and therefore do not accurately represent CMOS devices that are also subjected to HCI degradation.

SUMMARY

Embodiments of the present invention disclose a method, computer program product, and system for monitoring the health of a semiconductor chip. A computer system may determine a first set of output values for a set of test paths. Each output value may correspond to a test path in the set of test paths. The first set of output values may be determined at a first time. The computer system may then determine a second set of output values at a second time. Each output value in the second set of output values may have an associated output value in the first set of output values. The computer system may then determine whether possible degradation of the semiconductor chip has occurred by comparing the first set of output values to the second set of output values.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
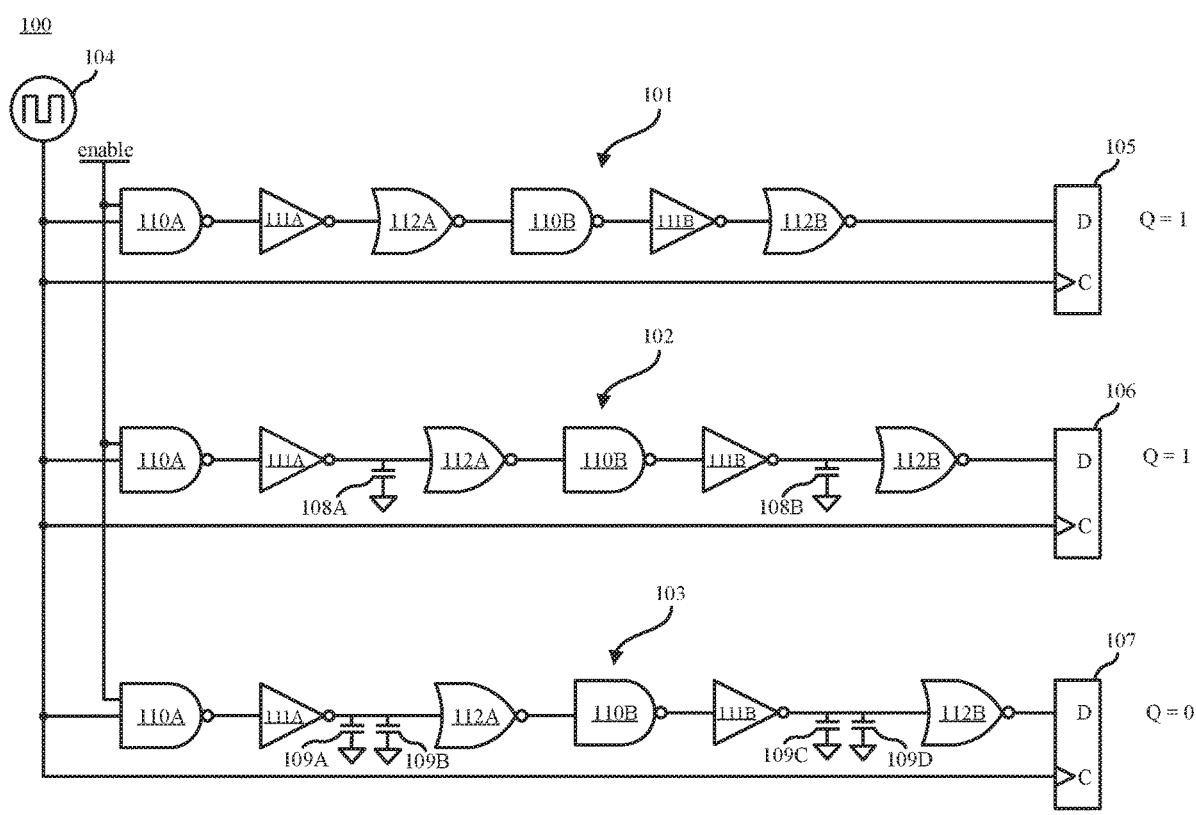
FIG. 1 illustrates an example set of test paths with varying delay times, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of computer hardware, and in particular to monitoring the health of semiconductor chips. While the present disclosure is not necessarily limited to such applications, various aspects of the disclosure may be appreciated through a discussion of various examples using this context.

Chip designers may use design rules such as timing margins to ensure that circuitry on a semiconductor chip is able to operate properly given the design specifications, such as the operating frequency. The semiconductor chip may include one or more integrated circuits made up of complementary metal-oxide semiconductor (CMOS) transistors. A timing margin may be the difference in the amount of time that it takes for a signal to propagate through an integrated circuit and the period (or clock cycle) of the system clock. For example, a semiconductor chip may be designed to run at 4 GHz, meaning that the system clock period may be 250 picoseconds. In order to ensure that the device operates properly, chip designers may design the integrated circuits on the semiconductor chip such that a signal can propagate through the integrated circuits in approximately 230 picoseconds, creating a timing margin of approximately 20 picoseconds. If the signal does not make it through the integrated circuit in time (e.g., within a clock period), subsequent operations (which are often triggered by the system clock and based on data output by the integrated circuit) may be performed on incorrect data.

For example, a processor may be connected to a set of registers. The processor may take data from the registers, perform a first operation on the data (e.g., perform an arithmetic operation such as incrementing an integer stored in the registers), and store the results back into the registers. During the next clock cycle, the processor may again pull data from the registers, perform a second operation on it (e.g., increment the integer again), and store the data back in the registers. If the first operation does not complete within a clock cycle (e.g., due to increased delay caused by degradation), subsequent operations (e.g., the second operation performed one clock cycle later) may not be performed on correct data because the data that was changed by the first operation may not have been stored back in the registers before the registers were read from again.

As a semiconductor chip degrades, the threshold voltage of CMOS transistors increases, and the drain current of CMOS transistors decreases. The increase in threshold voltage and decrease in drain current increases the delay time of the CMOS transistor. The delay time, as used herein, may include the amount of time a signal takes to propagate through an individual CMOS device (e.g., a transistor) or through a series of CMOS devices (e.g., an integrated circuit) that make up a semiconductor chip and/or other electronic component. For example, the delay time for the integrated circuit of the previous example is 230 picoseconds because that is the amount of time it takes for a signal to propagate through the integrated circuit. A user may wish to monitor the changes in the delay time in order to predict when a semiconductor chip will begin to experience failures so that the semiconductor chip can be preemptively replaced.

In some embodiments, a computer system may determine a first set of output values for a set of test paths. The test paths may be paths of electrically coupled electronic components (e.g., logic gates) connected to a system clock on one end and a data input pin of a latch on the other end. The latch may be connected to the system clock through its clock (or enable) input pin. The set of test paths may be located on the semiconductor chip. The set of test paths may draw current (e.g., be active) whenever the semiconductor chip is in use so that the test paths are subjected to substantially the same degradation as the semiconductor chip. The first set of output values may indicate whether the clock signal propagated all the way through the test paths in an amount of time that is less than the clock period. The computer system may determine the first set of output values at a time when the semiconductor chip has not substantially degraded.

In some embodiments, the computer system may also determine a second set of output values for the set of test paths. The second set of output values may be determined at a time subsequent to the time that the first set of output values were determined. The computer system may then determine whether substantial degradation of the semiconductor chip has occurred by comparing the first set of output values to the second set of output values. If the computer system determines that substantial degradation of the semiconductor chip has occurred, the computer system may alert a user. Otherwise, the computer system may wait for a period of time and then retest the semiconductor chip.

In some embodiments, the second set of output values may correspond to a set of reference paths. Each reference path in the set of reference paths may be structurally similar to a corresponding test path in the set of test paths. The set of reference paths may only be powered on when the computer system is determining the second set of output values. This may be done to minimize the amount of degradation the reference paths undergo. The computer system may then determine whether substantial degradation of the semiconductor chip has occurred by comparing the second set of output values to the first set of output values.

Other factors, such as temperature and supply voltage, also affect the delay time of semiconductor chips. The use of reference paths may help determine whether identified problems with the output values are attributable to degradation or transient factors, such as present temperature. This is because the output values of the reference paths may be determined under the same (or substantially similar) conditions as the output values of the test paths, unlike when output values are compared to baseline values taken when the semiconductor chip was potentially operating under different conditions (e.g., at a different temperature).

Because the reference paths are infrequently active and, therefore, do not experience significant degradation, differences between the second set of output values and the first set of output values may be attributable to degradation of the test paths.

In some embodiments, the computer system may determine whether substantial degradation of the semiconductor chip may have occurred by comparing a first and second set of output values for the set of test paths. If the computer system determines that substantial degradation of the semiconductor chip may have occurred, the computer system may determine a third set of output values for the test paths and a fourth set of output values for the reference paths. The computer system may then determine whether the incorrect values in the second set of output values was caused by transient factors (e.g., temperature) by comparing the third and fourth sets of output values. If the output values in the third and fourth sets match (e.g., if there are few incorrect values in the third set of output values as compared to the fourth set), the computer system may determine that transient factors caused the incorrect values in the second set of output values and that substantial degradation has not occurred.

Turning now to the figures, FIG. 1 illustrates an example set of test paths 100 with varying delay times, in accordance with embodiments of the present disclosure. The set of test paths 100 includes a first test path 101, a second test path 102, and a third test path 103, collectively referred to as the test paths 100. The test paths 100 are connected on one end to a system clock 104 and on the other end to the data input pins of latches (also referred to as flip-flops) 105-107.

Each test path 101-103 is connected to its own latch 105-107. For example, the first test path 101 is connected to the data input pin of a first latch 105. Likewise, the second test path 102 is connected to a second latch 106, and the third test path 103 is connected to a third latch 107. A clock input pin (or enable pin) of each latch 105-107 is connected directly to the system clock 104. Accordingly, the clock signal may act as the enable signal for the latches 105-107. When triggered (e.g., by an edge of the signal generated by the system clock 104), the latches 105-107 store (and/or output) the value present at their data input pins (e.g., a 1 or 0).

In some embodiments, the latches 105-107 may be edge-triggered latches. The edge-triggered latches may trigger when a rising edge (also known as a positive edge) is received at the clock input pin (e.g., when the clock signal generated by the system clock 104 transitions from a low state to a high state). In some embodiments, the edge-triggered latches may trigger when a falling edge (also known as a negative edge) is received at the clock input pin (e.g., when the clock signal generated by the system clock 104 transitions from a high state to a low state). The latches 105-107 may be any type of edge-triggered latch, such as a master-slave edge-triggered D-type flip-flop.

In some embodiments, the latches 105-107 may capture the value at the data input pin at any other definite portion of the clock cycle. For example, the latches 105-107 may capture the value of the data input pin whenever the clock signal has been in the high state for a specific amount of time. The clock may have a period (or clock cycle) of 250 picoseconds with a 50% duty cycle, meaning that the clock is in the high state for 125 picoseconds followed by the low state for 125 picoseconds. The latches may be designed to capture the value of the data input pin when the clock has been in the high state for 62 picoseconds. This may be done by adding a delay to the clock input in the latches, for example.

In some embodiments, the test paths 100 may be connected to an enable signal. The enable signal may be used to turn the test paths 100 on or off (e.g., to control the switching activity of the test paths 100). The switching activity of the test paths 100 may resemble (e.g., be based on) the switching activities of the semiconductor chip. This may be advantageous because the degradation of the semiconductor chip may depend on the switching activity of the semiconductor chip.

Each test path 101-103 in the set of test paths 100 may include a series of connected logic gates. Each test path 101-103 may be substantially similar, or identical, in structure to the other test paths in the set of test paths 100, with the exception of additional components added to increase the delay time of some test paths. For example, each test path 101-103 in the set of test paths 100 is made up of two NAND gates 110A and 110B, two NOR gates 112A and 112B, and two inverters (or NOT gates) 111A and 111B. Though not shown, the second (and/or subsequent) inputs for multi-input logic gates (e.g., NAND and NOR gates) may be driven to any value. For example, in order to ensure that each logic gate in the test paths 100 invert the input signal, the NAND gates 110A and 110B may have their second inputs driven high and the NOR gates 112A and 112B may have their second inputs be driven low.

The second test path 102 may also include a pair of capacitors (or capacitive loads) 108A and 108B. The capacitors 108A and 108B may be used to increase the delay time of the second test path 102 as compared to the first test path 101. The capacitors 108A and 108B may also be connected to ground. The first capacitor 108A may be in between the first inverter 111A and the first NOR gate 112A, and the second capacitor 108B may be between the second inverter 111B and the second NOR gate 112B. The inclusion of the capacitors 108A and 108B acts to increase the delay time of the second test path 102 because discharged capacitors initially act like a short circuit, drawing the current into the capacitor instead of allowing it to flow towards the next logic gate in the second test path 102.

The third test path 103 may include four capacitors 109A-109D. The four capacitors 109A-109D may also be connected to ground. Two capacitors 109A and 109B may be between the first inverter 111A and the first NOR gate 112A, and two capacitors 109C and 109D may be between the second inverter 111B and the second NOR gate 112B. The addition of the two additional capacitors in the third test path 103 (as compared to the second test path 102) may further increase the delay time of the third test path 103.

Each test path 101-103 may have an output value that is stored (or output) by the latches 105-107. The output value may be based on the period of the clock signal generated by the system clock 104, whether the test path is inverting or not, and the amount of delay caused by the test path 101-103. In embodiments where no delay is intentionally added to lines connecting the clock 104 to the latches 105-107, the delay in the clock lines may generally, though not always, be ignored. This may be because, in these embodiments, the delay on the clock line will usually be significantly smaller (e.g., by several orders of magnitude) than the delay caused by the logic gates in the test paths 100. In some embodiments, however, the delay on the clock line may affect the output value for a test path 101-103.

The output values of the various test paths 100 may not all be the same. For example, the output values Q for the first and second test paths 101 and 102 may be 1, indicating a high voltage on the data pins of the first and second latches 105 and 106 at the capture time. Meanwhile, the output value of the third test path 103 may be 0, indicating a low voltage on the data pin of the third latch 107 at the time of the capture. The output values of the test paths 100 may differ due to the different delay times of the test paths 100. For example, the clock signal that is launched into the first and second test paths 101 and 102 may be completed (e.g., reach the corresponding latch 105 and 106) in less than a single period (or cycle time) of the clock signal. Meanwhile, the clock signal launched into the third test path 103 may not propagate all the way through to the third latch 107 in under a single period of the clock signal, causing the third latch 107 to capture a low voltage signal.

In some embodiments, the values captured by the latches 105-107 may differ due to differences in the number, arrangement, or types of logic gates in the test paths 100. For example, while the test paths 100 may all be noninverting test paths, as is the case with the test paths 100 shown in FIG. 1, in some embodiments, the test paths 100 may include one or more inverting test paths and one or more noninverting test paths. Accordingly, even if the clock signal reaches the end of each test path 101-103 in under a single period, the captured values may differ because some of the signals have been inverted while others weren't. In some embodiments, the test paths 100 may all be inverting test paths (e.g., the signal that reaches the latches 105-107 is an inverted version of the clock signal).

In some embodiments, more or fewer capacitors than shown in FIG. 1 may be used. For example, a test path may only include a single capacitor instead of pairs of capacitors. The capacitors may also be placed between any components in the test paths 100. In some embodiments, the properties of the capacitors may be changed to increase the delay. This may be done instead of, or in addition to, increasing the number of capacitors in the test path. For example, instead of having four capacitors 109A-109D in the third test path 103, the third test path 103 may include two capacitors with higher capacitances than the two capacitors 108A and 108B in the second test path 102, causing the third test path 103 to have a higher delay than the second test path 102.

While the set of test paths 100 shown in FIG. 1 includes three test paths 101-103, any number of test paths may be present. In some embodiments, multiple test paths may have the same number of components and substantially the same structure. For example, two or more test paths may include the same number and types of logic gates, and the logic gates may be arranged substantially similar to each other. Likewise, the two or more test paths may include the same number of capacitors, and the capacitors may have substantially similar, or identical, capacitances.

In some embodiments, the structure of the test paths 100 may be designed according to the intended use of the semiconductor chip on which the test paths 100 are found. Chip designers may use design rules such as timing margins to ensure that circuitry on the semiconductor chip is able to operate properly given the design specifications, such as the operating frequency. For example, a semiconductor chip may be designed to run at 4 GHz, meaning that the system clock period may be 250 picoseconds. In order to ensure that the device operates properly, chip designers may design the CMOS circuits on the chip such that a signal can propagate through the circuits in approximately 230 picoseconds, creating a timing margin of 20 picoseconds. Accordingly, the test paths 100 may be similarly designed to take between 220 picoseconds and 260 picoseconds to complete in order to increase the likelihood that the test paths 100 are representative of the semiconductor chip being monitored, and that identified degradation of the test paths 100 is representative of the degradation of the semiconductor chip. Some of the test paths 100 may be designed to take longer than a clock cycle (e.g., longer than 250 picoseconds in the example) in order to create a reference point, as discussed herein.

In some embodiments, the number and properties of the capacitors added to the test paths 100 may be determined based on a desired level of granularity for the monitoring. For example, a user may wish to be able to identify degradation of the monitored semiconductor chip in 1% increments. If the delay time of the series of logic gates (e.g., the test paths that do not include any capacitors, such as the first test path 101) is 200 picoseconds, the number of, and/or capacitance of, capacitors added to other test paths may be chosen such that each test path 101-103 has an increased delay of approximately 2 picoseconds over the test path(s) with the next smallest delay. By increasing the level of granularity (e.g., decreasing the difference in timing delay between test paths), the computer system may be able to more accurately predict when a semiconductor chip needs to be replaced.

In some embodiments, the output values of all test paths 100 may be the same, at least prior to any degradation occurring. In other embodiments, the test paths 100 may include at least one test path with a first output value (e.g., high or 1) and at least one test path with a second output value (e.g., low or 0). This may be particularly advantageous in that it may create a reference point allowing a computer system or user to identify the initial size of the timing margin. For example, if each capacitor delays the propagation of the signal by 5 picoseconds, and the output values of the first test path 101 (with no capacitors) and of the second test path 102 (with 2 capacitors) are both 1 while the output value of the third test path 103 (with 4 capacitors) is 0, the computer system may determine that the initial timing margin for the first test path 101, which does not include any capacitors, is between 10 and 20 picoseconds.

In some embodiments, the computer system may calibrate the test paths 100 in order to determine the delay or timing margin of each test path by changing the clock period. The computer system may check the output values at each latch for the different clock periods. If the output value of a test path changes when the clock signal changes from a first period to a second period, the computer system may determine that the delay for the test path is between the first and second periods.

For example, a test path may have an output value of 1 when the clock period is 250 picoseconds. The computer system may change the clock period to 240 picoseconds and check the output value of the test path again. If the output value has changed to a 0, the computer system may determine that the delay of the test path is between 240 picoseconds and 250 picoseconds. If the output value has not changed, the computer system may change the clock period again (e.g., to 230 picoseconds) and check the output values again. The process may be performed until each test path's delay has been determined.

Figure 2:
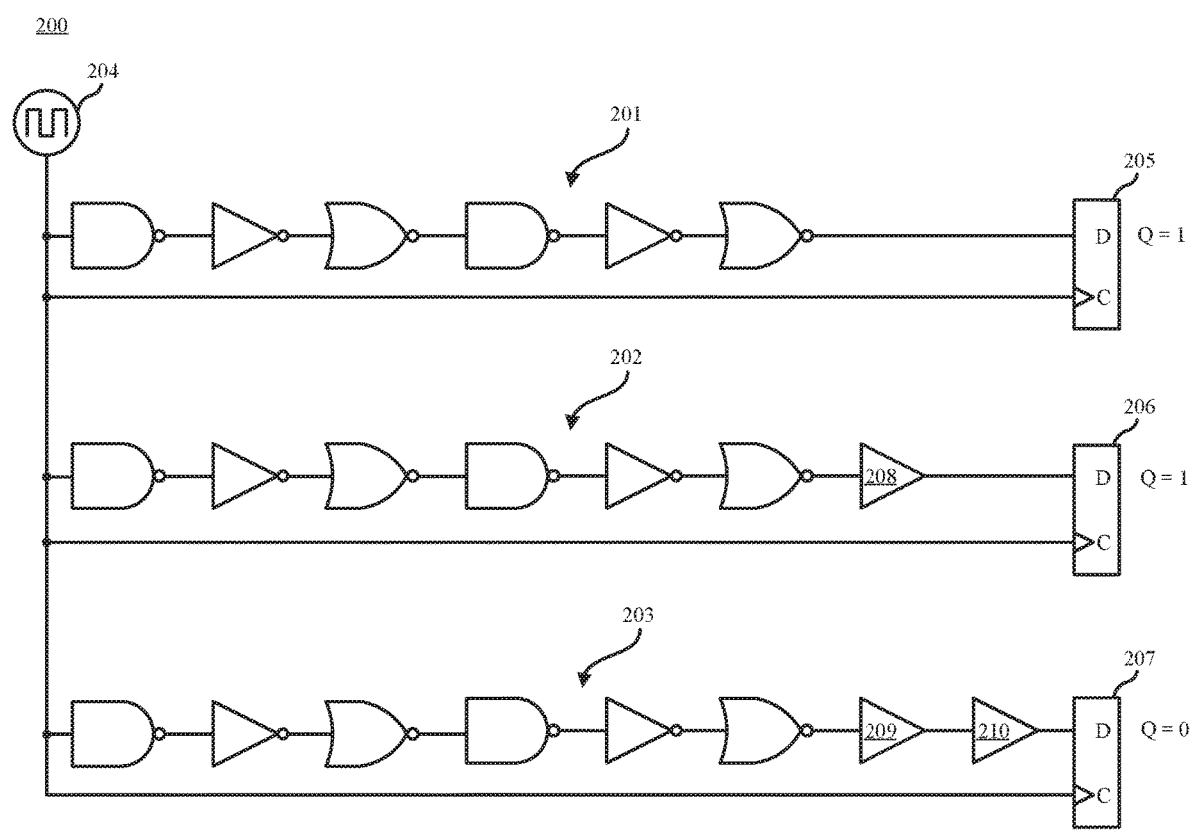
FIG. 2 illustrates another example set of test paths with varying delay times, in accordance with embodiments of the present disclosure.

Referring now to FIG. 2, shown is another example set of test paths 200 with varying delay times, in accordance with embodiments of the present disclosure. The set of test paths 200 includes a first test path 201, a second test path 202, and a third test path 203, collectively referred to as the test paths 200. The test paths 200 are connected on one end to a system clock 204 and on the other end to the data input pins of latches (also referred to as flip-flops) 205-207. A clock input pin (or enable pin) of each latch 205-207 is connected directly to the system clock 204. Accordingly, the clock signal may act as the enable signal for the latches 205-207. When triggered (e.g., by an edge of the signal generated by the system clock 204), the latches 205-207 store (and/or output) the value present at their data input pins (e.g., a 1 or 0). The latches 205-207 may be any type of latches, such as those discussed in reference to the latches 105-107 in FIG. 1. For example, the latches 205-207 may be edge-triggered latches. In some embodiments, the test paths 200 may be connected to an enable signal to control the switching activity of the test paths 200, as discussed in reference to the test paths 100 in FIG. 1.

The second test path 202 may also include a delay circuit 208. The delay circuit 208 may, in some embodiments, be any type of circuit that delays the propagation of a signal but does not invert the signal. For example, the delay circuit 208 may be comprised of two inventers arranged sequentially. The delay circuit 208 may be used to increase the delay time of the second test path 202 as compared to the first test path 201. The delay circuit 208 is shown at the end of the test path 202, right before the signal is transmitted to the second latch 206. This is not necessary and, in some embodiments, the delay circuit 208 may be placed elsewhere in the second test path 202 (e.g., at the beginning).

The third test path 203 may include two delay circuits 209 and 210. The two delay circuits 209 and 210 are connected at the end of the third test path 203, right before the third latch 207. In some embodiments, the two delay circuits 209 and 210 may be found at other parts of the third test path 203 (e.g., at the beginning). In some embodiments, each delay circuit 209 and 210 may be in a different part of the third test path 203. For example, the first delay circuit 209 may be at the beginning of the third test path 203, and the second delay circuit 210 may be at the end of the third test path 203. The addition of the two delay circuits 209 and 210 in the third test path 203 may further increase the delay time of the third test path 203.

Each test path 201-203 may have an output value that is stored by, or output by, the latches 205-207, as discussed in reference to the test paths 100 in FIG. 1. The output values of the various test paths 200 may not all be the same. For example, the output values Q for the first and second test paths 201 and 202 may be 1, indicating a high voltage on the data pins of the latches 205 and 206 at the capture time. Meanwhile, the output value of the third test path 203 may be 0, indicating a low voltage on the data pin of the third latch 207 at the time of the capture. The output values of the test paths 200 may differ due to the different delay times of the test paths 200. In some embodiments, the values captured by the latches 205-207 may differ due to differences in the number, arrangement, and types of logic gates in the test paths 200, as discussed in reference to the test paths 100 in FIG. 1.

While the set of test paths 200 shown in FIG. 2 includes three test paths 201-203, any number of test paths may be present. In some embodiments, multiple test paths may have the same number of components and substantially the same structure. For example, two or more test paths may include the same number and types of logic gates and the logic gates may be arranged substantially similar to, or identical to, each other. Likewise, the two or more test paths may include the same number of delay circuits, and the delay circuits may have substantially similar, or identical, delay times.

In some embodiments, more or fewer delay circuits than shown in FIG. 2 may be used. For example, a test path may include three delay circuits. In some embodiments, the properties of the delay circuits may be changed to increase the delay. This may be done instead of, or in addition to, increasing the number of delay circuits in the test path. For example, in some embodiments, the third test path 203 may include a single delay circuit that is configured to delay the propagation of the clock signal by a greater amount that the delay circuit 208 found in the second test path 202, instead of using two delay circuits 209 and 210.

In some embodiments, the structure of the test paths 200 may be designed according to the intended use of the semiconductor chip on which the test paths 200 are found and the desired level of granularity of the monitoring, as discussed in reference to the test paths 100 in FIG. 1. In some embodiments, the output values of all test paths 200 may be the same, at least prior to any degradation occurring. In other embodiments, the test paths 200 may include at least one test path with a first output value (e.g., high or 1) and at least one test path with a second output value (e.g., low or 0) to create a reference point allowing the computer system to identify the initial size of the timing margin. For example, if each delay circuit delays the propagation of the signal by 5 picoseconds, and the output values of the first test path 101 (with no delay circuits) and of the second test path 202 (with a single delay circuit 208) are both 1 while the output value of the third test path 203 (with two delay circuits 209 and 210) is 0, the computer system may determine that the initial timing margin for the first test path 201 (which has no delay circuits) is between 5 and 10 picoseconds.

Figure 3:
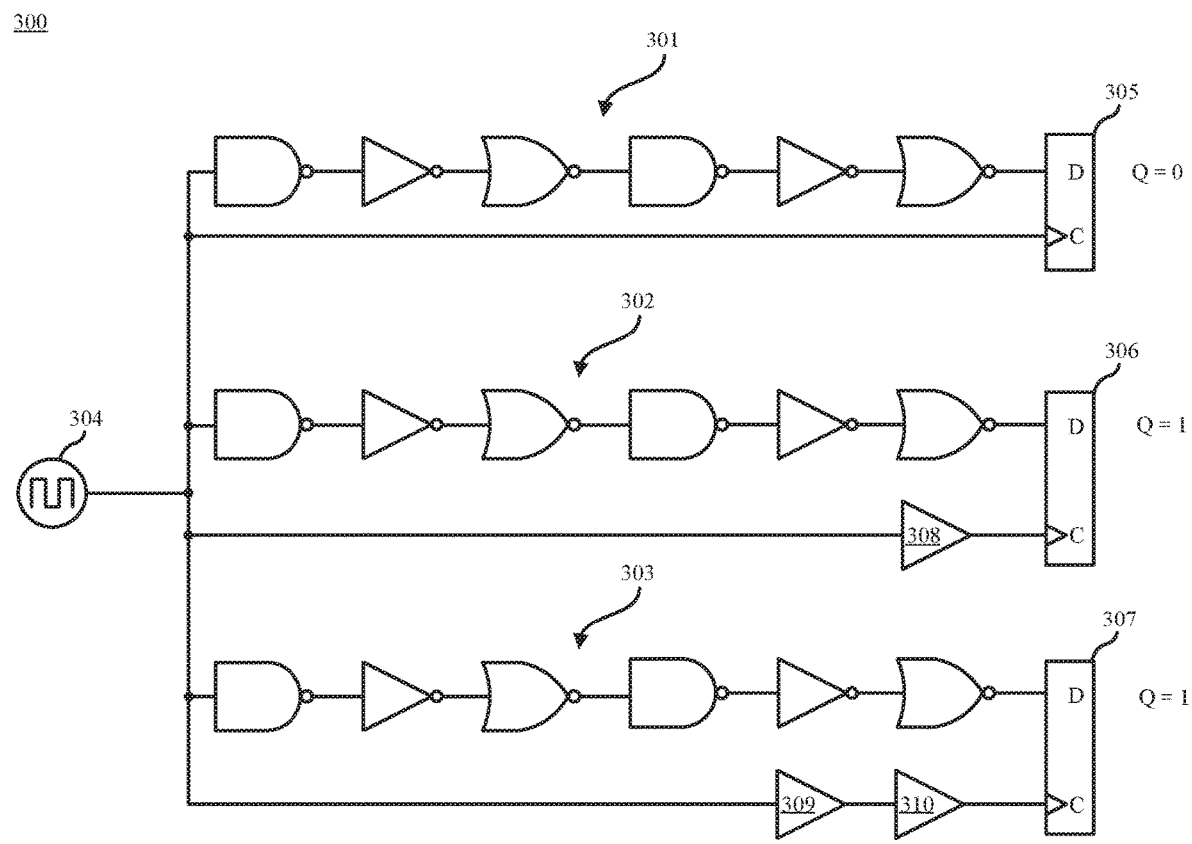
FIG. 3 illustrates yet another example set of test paths with varying delay times, in accordance with embodiments of the present disclosure.

Referring now to FIG. 3, shown is yet another example set of test paths 300 with varying delay times, in accordance with embodiments of the present disclosure. The set of test paths 300 includes a first test path 301, a second test path 302, and a third test path 303, collectively referred to as the test paths 300. The test paths 300 are connected on one end to a system clock 304 and on the other end to the data input pins of latches (also referred to as flip-flops) 305-307. A clock input pin (or enable pin) of each latch 305-307 is connected directly to the system clock 304. Accordingly, the clock signal may act as the enable signal for the latches 305-307. When triggered (e.g., by an edge of the signal generated by the system clock 304), the latches 305-307 store (and/or output) the value present at their data input pins (e.g., a 1 or 0). The latches 305-307 may be any type of latches, such as those discussed in reference to the latches 105-107 in FIG. 1. For example, the latches 305-307 may be edge-triggered latches. In some embodiments, the test paths 300 may be connected to an enable signal to control the switching activity of the test paths 300, as discussed in reference to the test paths 100 in FIG. 1.

A delay circuit 308 may be added to the clock line for the second test path 302 (e.g., to the line connecting the system clock 304 to the second latch 306). The delay circuit 308 may, in some embodiments, be any type of circuit that delays the propagation of a signal but does not invert the signal. For example, the delay circuit 308 may be comprised of two inventers arranged sequentially. The delay circuit 308 may be used to increase the delay time of the clock signal, shifting the capture time for the second latch 306 and, accordingly, the timing margin for the second test path 302. The third test path 303 may include two delay circuits 309 and 310 added to the clock line. The addition of the two delay circuits 309 and 310 in the third test path 303 may further increase the delay time of the clock signal for the third test path 303.

Each test path 301-303 may have an output value that is stored, or output, by the latches 305-307, as discussed in reference to the test paths 100 in FIG. 1. The output values of the test paths 300 may be based on the delay time of the signal propagating through the logic gates, as well as the delay time of the clock signal. For example, if the logic gates in the second test path 302 cause a delay of 230 picoseconds, and the clock signal for the second test path 302 is delayed by 30 picoseconds by the delay circuit 308, the second latch 306 may capture an output value that is the same as if the logic gates had caused a delay of 200 picoseconds and there was no delay in the clock signal. Accordingly, the output value Q for the second test path 302 may be a 1 if the period of the clock signal is 250 picoseconds because the combined delay of the logic gates and the delay circuit 308 is less than one clock cycle.

The output values of the various test paths 300 may not all be the same. For example, the output value Q for the first test path 301 may be 0, indicating a low voltage on the data pin of the first latch 305 at the capture time. Meanwhile, the output values of the second and third test paths 302 and 303 may be 1, indicating a high voltage on the data pins of the latches 306 and 307 at the capture time. The output values of the test paths 300 may differ due to the different delay times of clock signals for the test paths 300.

While the set of test paths 300 shown in FIG. 3 includes three test paths 301-303, any number of test paths may be present. In some embodiments, multiple test paths may have the same number of components and substantially the same structure. For example, two or more test paths may include the same set of logic gates and the logic gates may be arranged substantially similar to, or identical to, each other. Likewise, the two or more test paths may include the same number of delay circuits on the clock lines, and the delay circuits may have substantially similar, or identical, delay times.

In some embodiments, more or fewer delay circuits than shown in FIG. 3 may be used. For example, a test path may include three delay circuits in its clock line. In some embodiments, the properties of the delay circuits may be changed to increase the delay. This may be done instead of, or in addition to, increasing the number of delay circuits in the clock line. For example, in some embodiments, the third test path 303 may include a single delay circuit that is configured to delay the propagation of the clock signal by a greater amount that the delay circuit 308 found in the second test path 302, instead of using two delay circuits 309 and 310.

In some embodiments, the structure of the test paths 300 may be designed according to the intended use of the semiconductor chip on which the test paths are found and the desired level of granularity of the monitoring, as discussed in reference to the test paths 100 in FIG. 1. In some embodiments, the output values of all test paths 300 may be the same, at least prior to any degradation occurring. In other embodiments, the test paths 300 may include at least one test path with a first output value (e.g., high or 1) and at least one test path with a second output value (e.g., low or 0) to create a reference point allowing the computer system to identify the initial size of the timing margin.

Figure 4:
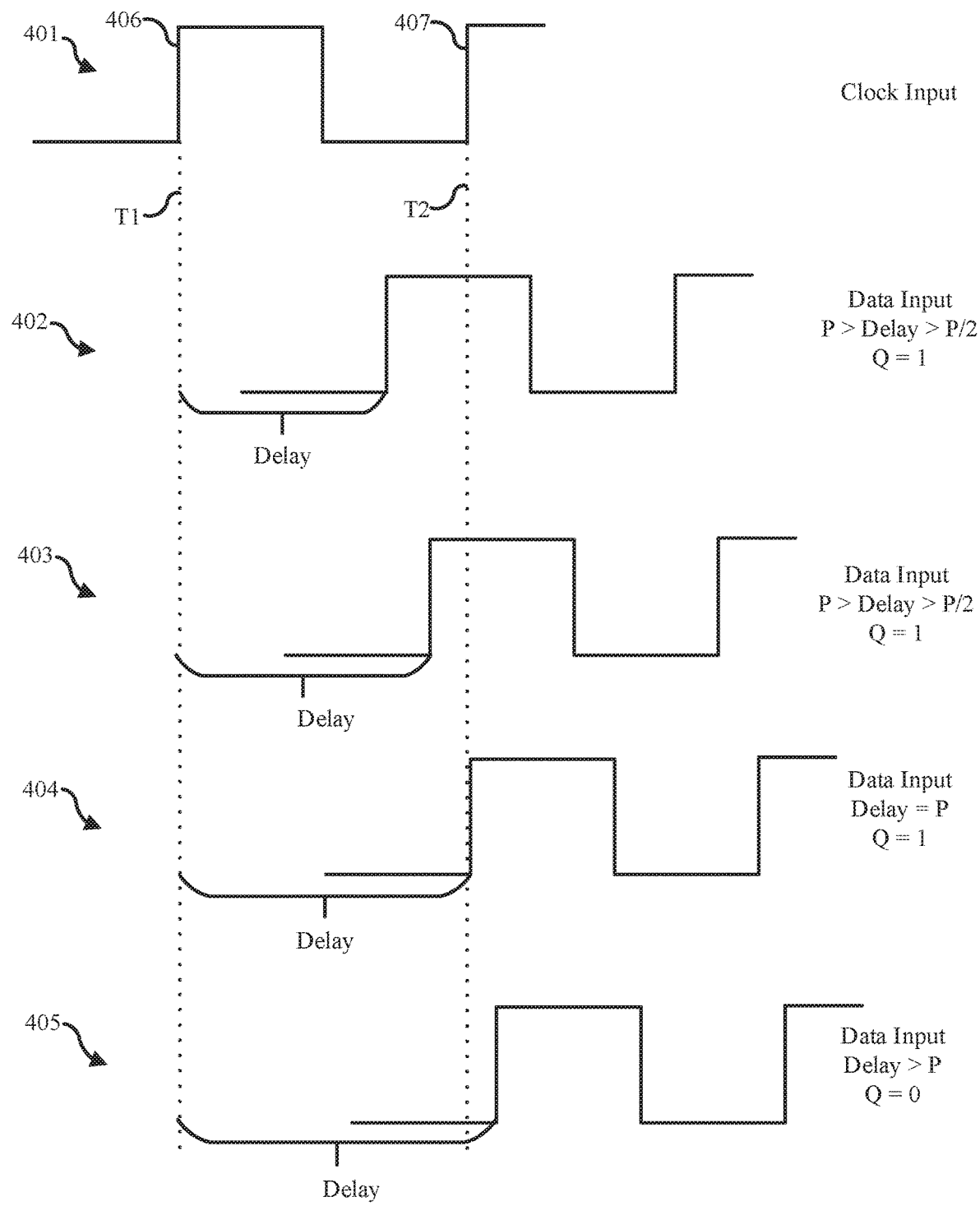
FIG. 4 illustrates a set of plots of the signal received by the clock input pin and the data input pin of a latch used in a test path according to varying delay times, in accordance with embodiments of the present disclosure.

Referring now to FIG. 4, shown is a set of plots 400 of the signal received by the clock input pin and the data input pin of a latch used in a test path according to varying delay times, in accordance with embodiments of the present disclosure. The first plot 401 is a plot of the clock signal received at the clock input pin of a latch at the end of a test path (e.g., the first latch 105 for the first test path 101 in FIG. 1). The second through fifth plots 402-405 illustrate the signal received at the data input pin of the latch. Each plot 402-405 corresponds to a different amount of delay caused by the logic gates in the test path. The delay shown in the plots 402-405 is the combined delay of the clock lines and the test paths. The latch may be an edge-triggered latch that triggers on a rising edge of the clock signal (e.g., when the clock signal transitions from a low state to a high state). Though approximately one and a half clock cycles are shown in the set of plots 400, it should be understood that the clock signal may be a continuous signal.

The launch edge 406 of the clock signal may be the first rising edge received by the latch (e.g., the first edge of the clock signal that is launched into the test paths and the clock inputs of the latch). The latch may receive the launch edge 406 of the clock signal at a first time T1. The latch may be configured to capture the value at the data pin upon receiving subsequent rising edges. In other words, a rising edge-triggered latch may capture a value when it receives the first rising edge at its clock (or enable) input pin after receiving the launch edge 406. Accordingly, the latch may capture the value on the data pin when the capture edge 407, which is the next rising edge in the clock signal, is received at a second time T2, also referred to as the capture time. The period of the clock signal may be the difference between the first time T1 and the second time T2 (e.g., the time difference between two rising edges).

The second plot 402 illustrates a plot of the data signal received by the latch when the delay in the signal propagating through the test path is greater than half of the period of the clock signal, but less than a full period. Delays caused by the logic gates in the test path shift the signal to the right. Accordingly, the signal in the second plot 402 is shifted to the right by the delay amount with respect to the clock signal shown in the first plot 401. Because the data input pin is in a high state (i.e., has a high voltage applied to it) at the capture time T2, the output value Q may be 1.

The third plot 403 illustrates a second plot of the data signal received by the latch when the delay in the signal propagating through the test path is greater than half of the period of the clock signal and less than a full period. The delay shown in the third plot 403 is greater than the delay shown in the second plot 402. Because the data input pin is in a still in the high state (i.e., has a high voltage applied to it) at the capture time T2, the output value Q may be 1.

The fourth plot 404 illustrates a plot of the data signal received by the latch when the delay in the signal propagating through the test path is equal to the period of the clock signal. Accordingly, the signal in the fourth plot 404 is shifted to the right by an amount equal to the clock cycle with respect to the clock signal shown in the first plot 401. Because the data input pin is in a high state (i.e., has a high voltage applied to it) at the capture time T2, the output value Q may be 1. The fifth plot 405 illustrates a plot of the data signal received by the latch when the delay in the signal propagating through the test path is greater than the period of the clock signal. Accordingly, the signal in the fifth plot 405 is shifted to the right by an amount greater than the clock cycle with respect to the clock signal shown in the first plot 401. Because the data input pin is in a low state (i.e., has a low voltage applied to it) at the capture time T2, the output value Q may be 0.

Figure 5:
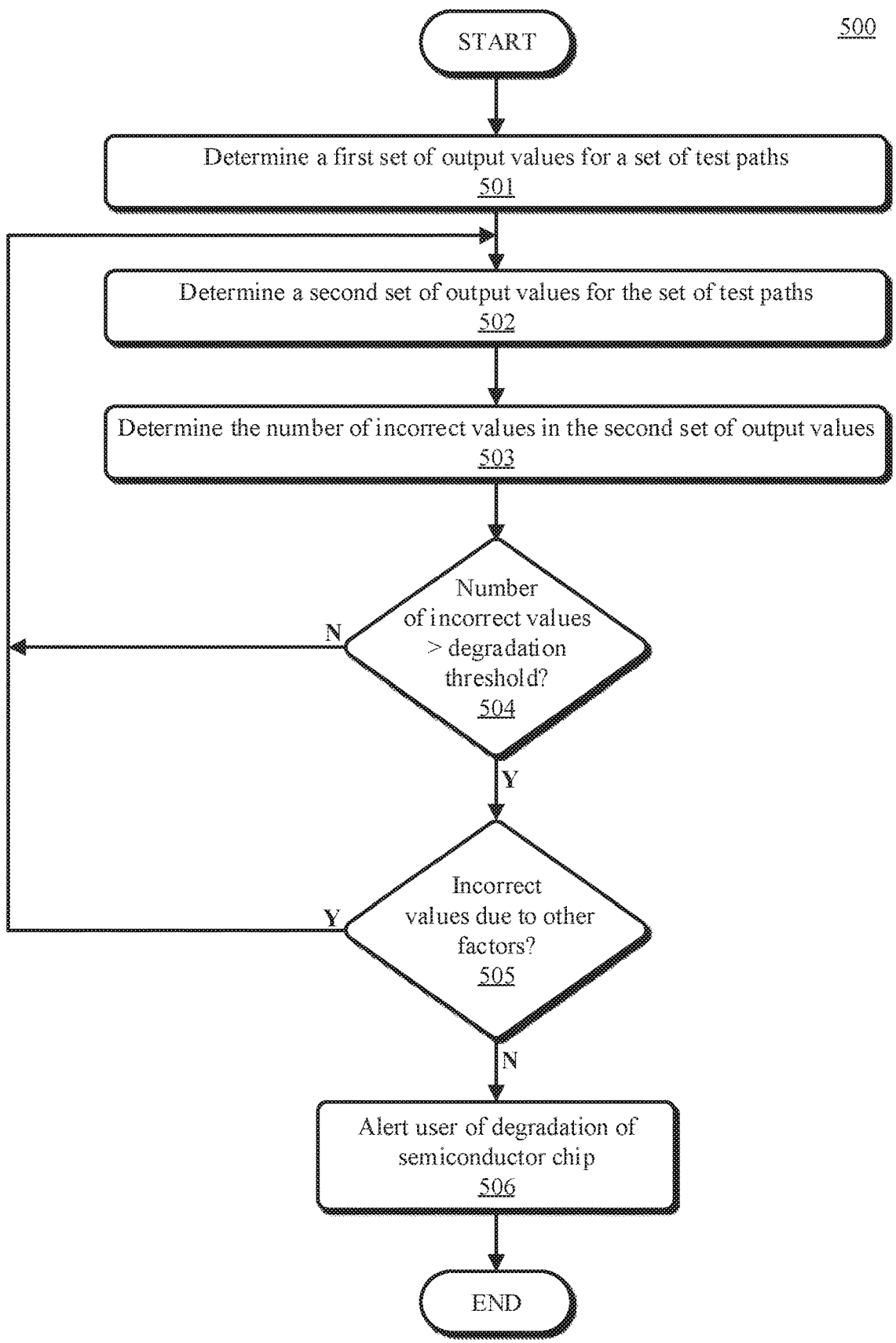
FIG. 5 illustrates a flowchart of an example method for determining whether a semiconductor chip has undergone substantial degradation, in accordance with embodiments of the present disclosure.

Referring now to FIG. 5, shown is a flowchart of an example method 500 for determining whether a semiconductor chip has undergone substantial degradation, in accordance with embodiments of the present disclosure. The method 500 may be performed by a computer system. In some embodiments, one or more operations in the method 500 may be performed by a user, or by the computer system in response to user input. The method 500 may begin at operation 501, where the computer system may determine a first set of output values for a set of test paths.

The set of test paths may include one or more paths of logic gates and/or other electronic components (such as capacitors and/or delay circuits). The test paths may be attached to a system clock at one end and to a data input of a latch or flip-flop at the other end. The clock input (or enable input) of the latch may also be connected to the system clock. Example test paths are discussed in reference to FIGS. 1-3.

The test paths may be used to monitor the health of integrated circuits made using CMOS technology, such as a CPU comprising CMOS transistors. Accordingly, the test paths may be placed on the printed circuit board (PCB) that includes the CMOS integrated circuit. In some embodiments, the test paths may be built into the CMOS integrated circuit (e.g., be a part of the integrated circuit). A PCB that includes the CMOS integrated circuit may be referred to herein as a semiconductor chip. In some embodiments, the test paths may be used to monitor the health of any type of semiconductor chip (e.g., any type of computer hardware that uses CMOS transistors). For example, in addition to CPUs, the test paths may be used to monitor the health of microprocessors, microcontrollers, static random-access memory (SRAM), and other digital logic circuits that use CMOS technologies. Because the test paths are used as analogs for the circuitry in the semiconductor chip, the transistors in the test paths may be CMOS transistors.

In some embodiments, the computer system may determine the first set of output values for the test paths at a time when the semiconductor chip is known to be, or is suspected to be, operational. In other words, the computer system may determine the first set of output values for the test paths prior to substantial degradation of the semiconductor chip. Substantial degradation, as used herein, includes an amount of degradation that may cause the semiconductor chip to fail to work properly.

In some embodiments, the computer system may use electronic circuit simulation techniques to determine the first set of output values for the set of test paths. Electronic circuit simulation uses mathematical models to replicate the behavior of electronic devices and/or circuits. Electronic circuit simulators are either analog simulators or mixed-mode simulators, which are capable of both analog and event-driven digital simulation. The computer system may, in some embodiments, use the electronic circuit simulation to calculate values for each test path with the assumption that no degradation of the semiconductor chip has occurred in order to establish base-line output values (e.g., output values for test paths that have not degraded).

In order to determine the first set of output values, in some embodiments, the computer system may launch a clock signal into the test paths. The clock signal may simultaneously be launched into the latches at the end of the test paths. The output values for each test path may be captured by the latch at a specified time. For example, if the latch is an edge-triggered latch, the output values may be captured by the latch when the clock signal attached to the latch transitions from the low state to the high state (or from the high state to the low state). The output values may then be transmitted by the latch to a degradation detection module. The degradation detection module may be either a hardware or a software module that is configured to store the first set of output values.

After determining a first set of output values at operation 501, the computer system may determine a second set of output values for the set of test paths at operation 502. The computer system may determine the second set of output values at a time subsequent to the time when the first set of output values was determined (e.g., hours, days, weeks, or months later). The computer system may determine the second set of output values in much the same way as discussed in reference to operation 501. For example, if the latch is an edge-triggered latch, the output values may be captured by the latch when the clock signal attached to the latch transitions from the low state to the high state (or from the high state to the low state). The output values may then be transmitted by the latch to the degradation detection module, which may be further configured to store the second set of output values.

After determining the second set of output values at operation 502, the computer system may determine the number of incorrect values in the second set of output values at operation 503. In some embodiments, the computer system may compare each output value in the first set of output values to an associated output value in the second set of output values. Output values may be associated if they correspond to the same test path in the set of test paths. For example, the set of test paths may include a first test path. A first output value for the first test path may be included in the first set of output values determined at operation 501. Likewise, a second output value for the first test path may be included in the second set of output values determined at operation 502. Because the first and second output values both correspond to (e.g., were captured from) the first test path, they may be considered associated output values.

An output value in the second set of output values may be considered incorrect if it differs from its associated output value in the first set of output values (e.g., if the value for a particular test path is different in the sets of output values). The computer system may compare each output value in the second set of output values to its associated output value in the first set of output values to determine the number of incorrect values.

After determining the number of incorrect values in the second set of output values at operation 503, the computer system may compare the number of incorrect values in the second set of output values to a degradation threshold to determine whether substantial degradation of the semiconductor chip may have occurred at decision block 504. If the number of incorrect values in the second set of output values exceeds the degradation threshold, the computer system may determine that substantial degradation of the semiconductor chip may have occurred. Otherwise, the computer system may determine that substantial degradation of the semiconductor chip has not occurred.

In some embodiments, the degradation threshold may be set by a user. The user may set the degradation threshold according to the granularity of the test paths (e.g., the difference in delay time between test paths) and the acceptable timing margin for the user. For example, the semiconductor chip may be set to run at 4 GHz and have a clock cycle of 250 picoseconds. The semiconductor chip may have been designed to complete every action in 230 picoseconds, leaving a 20 picosecond timing margin prior to any degradation of the semiconductor chip. The set of test paths may include 10 test paths, each test path being configured to have a delay 2 picoseconds longer than the previous test path. Accordingly, the first test path may be configured to have a delay of 230 picoseconds prior to any degradation of the device, the second test path may be configured to have a delay of 232 picoseconds prior to degradation, and so on. The tenth test path may be configured to have a delay of 248 picoseconds, prior to degradation. Accordingly, the first set of output values for the set of test paths may all be the same (e.g., all 1s or all 0s) because each test path is configured to be completed in less than a clock cycle.

As the semiconductor chip and test paths degrade over time, some of the test paths will begin to output the opposite value (e.g., an incorrect value). For example, after degradation has increased the delay time of the semiconductor chip and test paths by 3 picoseconds, the tenth test path may output an incorrect value because its new delay time will be 251 picoseconds, which exceeds the clock cycle of 250 picoseconds. If the user decides that the minimum acceptable timing margin for the semiconductor chip is 10 picoseconds (meaning a signal must propagate through a test path in 240 picoseconds or less), the user may set the degradation threshold at 5 incorrect output values. This may be because the sixth test path, which is likely to be the fifth test path to fail, was configured to have a delay of 240 picoseconds prior to degradation (e.g., have a time margin of 10 picoseconds). Once the sixth test path fails, the semiconductor chip's timing margin may be under 10 picoseconds.

In other embodiments, the degradation threshold may be automatically determined by the computer system. The computer system may use historical information about the user, or about other users or devices, in order to set the degradation threshold. For example, the computer system may determine the number of incorrect output values that other semiconductor chips had when they failed or were replaced. The computer system may then set the degradation threshold accordingly. If the other semiconductor chips were replaced, but had not failed, the degradation threshold may be set at the number of incorrect output values at the time of replacing. If a previous semiconductor chip failed, the computer system may set the degradation threshold to be a lower number of incorrect values than the number present at the time the previous semiconductor chip failed.

In some embodiments, the computer system may determine the percentage of output values in the second set of output values that are incorrect instead of the number of incorrect values. The degradation threshold may be accordingly set as the maximum percentage of incorrect output values in the second set of output values that are acceptable to the user. The use of a percentage instead of a number may be particularly advantageous when the degradation threshold is set based on historical data (e.g., failure data from other devices) because each semiconductor chip may have a different number of test paths.

If the computer system determines that substantial degradation of the semiconductor chip has not occurred at decision block 504, the method 500 may proceed to operation 502. The method 500 may proceed to operation 502 after a delay (e.g., after a few hours, a week, a month, etc.). The delay may be based on how often a user wants to check the semiconductor chip for degradation. For example, if a user wants to check the semiconductor device for degradation once a week, the delay may be one week long. If, however, the computer system determines that substantial degradation of the semiconductor chip may have occurred at decision block 504, the computer system may determine whether the incorrect values in the second set of output values were caused by other factors (e.g., not by permanent degradation of the test paths) at decision block 505.

In some embodiments, incorrect values may be caused by transient factors (e.g., nonpermanent factors), such as the temperature of the device and the supply voltage, and not by degradation of the test paths. Accordingly, the computer system may determine the extent to which the transient factors, and not degradation, are responsible for the incorrect values. In some embodiments, the computer system may use measurement devices to determine physical properties of the test paths. For example, the computer system may determine the supply voltage and the temperature of the semiconductor chip. The computer system may then determine whether either the temperature or the supply voltage is responsible for one or more of the incorrect values. For example, if the computer system determines that elevated temperatures are causing a 5 picosecond increase in the delay time and the test circuits have a 2 picosecond granularity, the computer system may determine that two of the incorrect values are attributable to the temperature and not degradation. If the computer system determines that transient factors are responsible for one or more incorrect values, the computer system may subtract out the one or more incorrect values caused by transient factors from the total number of incorrect values and compare the new number of incorrect values to the degradation threshold. If the new number still exceeds the degradation threshold, the computer system may determine that the incorrect values were not due to other factors at decision block 505, and the computer system may alert the user at operation 506. Otherwise, the method 500 may wait for a period of time before proceeding to operation 502.

There are numerous ways in which the computer system may alert the user of the degradation of the semiconductor chip. For example, the computer system may provide a warning message to the user using an output device, such as a computer monitor. As another example, the computer system may illuminate a warning indicator on the semiconductor chip or elsewhere on the computer hardware. In some embodiments, the computer system may send a warning to a remote device (e.g., another computer system, a smartphone, or a tablet) that is communicatively coupled with the computer system in which the semiconductor chip is installed (e.g., over a network). After alerting the user of degradation of the semiconductor chip at operation 506, the method 500 may end.

Figure 6:
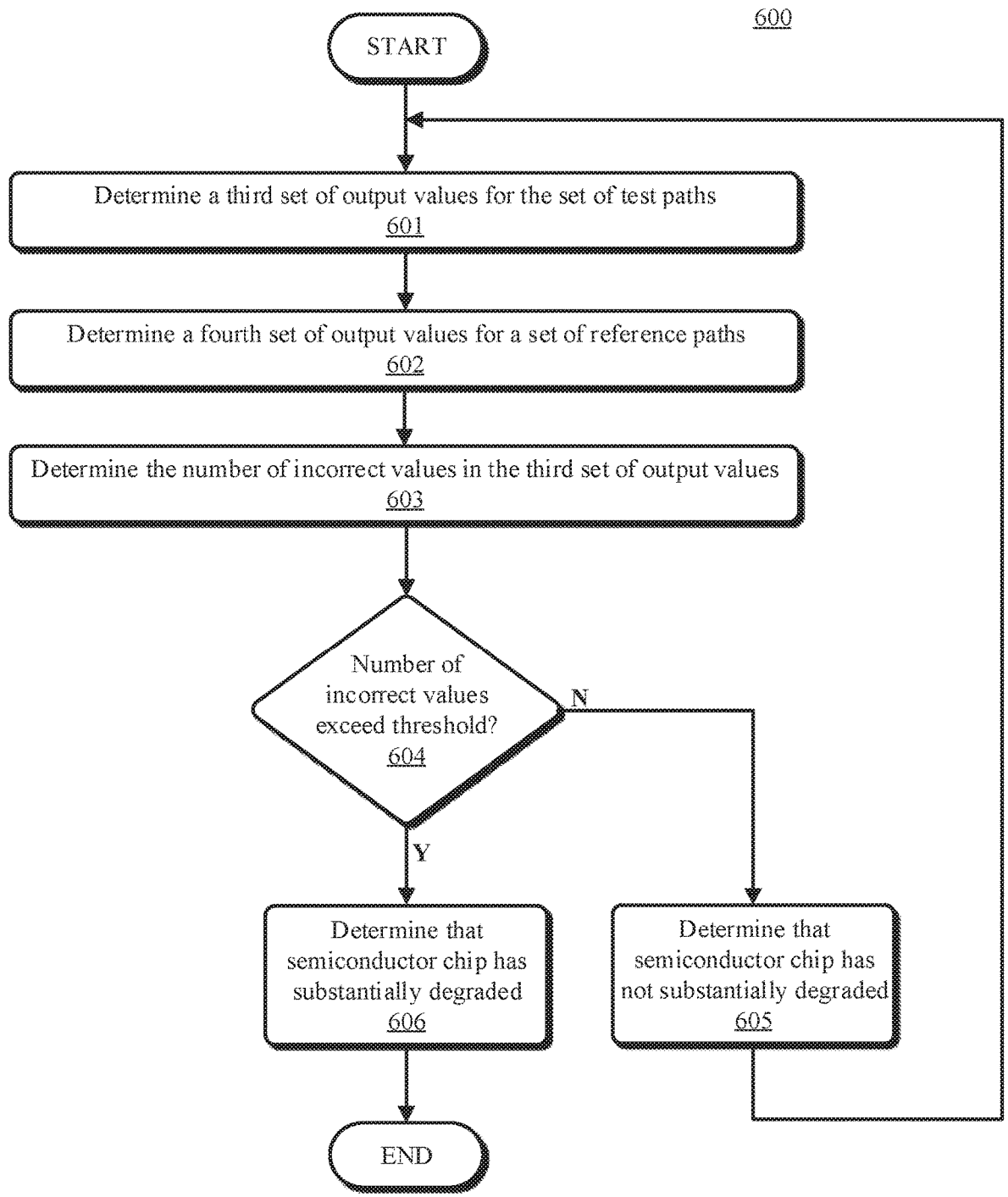
FIG. 6 illustrates a flowchart of an example method for determining whether a semiconductor chip has undergone substantial degradation using reference paths, in accordance with embodiments of the present disclosure.

Referring now to FIG. 6, shown is a flowchart of an example method 600 for determining whether a semiconductor chip has undergone substantial degradation using reference paths, in accordance with embodiments of the present disclosure. The method 600 may be performed by a computer system. In some embodiments, the method 600 may be performed in response to the computer system identifying possible degradation of a semiconductor chip (e.g., after decision block 504 in FIG. 4) in order to determine whether the possible degradation was caused by transient factors. In other embodiments, the method 600 may be performed every time the computer system tests the semiconductor chip for degradation.

The method 600 may begin at operation 601, where the computer system may determine a third set of output values. The third set of output values may be a set of output values for the set of test paths. The computer system may determine the third set of output values in much the same way as discussed in reference to operations 501 and 502 in FIG. 5. For example, if the latch is an edge-triggered latch, the output values may be captured by the latch when the clock signal attached to the latch transitions from the low state to the high state (or from the high state to the low state). The output values may then be transmitted by the latch to a degradation detection module, which may be configured to store the third set of output values.

After determining a third set of output values for the test paths at operation 601, the computer system may determine a fourth set of output values at operation 602. The fourth set of output values may be a set of output values for a set of reference paths. The computer may determine the fourth set of output values at substantially the same time as it determined the third set of output values at operation 601. This may be to ensure that any transient factors that may affect the third set of output values (e.g., temperature) are also substantially the same when the fourth set of output values are determined. The computer system may determine the fourth set of output values in much the same way as discussed in reference to operation 501. The output values may then be transmitted by the latch to the degradation detection module, which may be further configured to store the fourth set of output values.

After determining the fourth set of output values at operation 602, the computer system may determine the number of incorrect values in the third set of output values at operation 603. In some embodiments, the computer system may compare each output value in the third set of output values to an associated output value in the fourth set of output values. Output values may be associated if they correspond to associated test and reference paths. For example, the set of test paths may include a first test path. The first test path may have an associated reference path (e.g., a reference path with a substantially similar, or identical, configuration of electronic components). The computer system may determine a first output value for the first test path and a second output value for the associated reference path. Because the first and second output values correspond to associated paths, they may be considered associated output values and the computer system may compare them to determine if the first output value is incorrect. The computer system may compare each output value in the third set of output values to its associated output value in the fourth set of output values to determine the number of incorrect values.

After determining the number of incorrect values in the third set of output values at operation 603, the computer system may compare the number of incorrect values in the third set of output values to the degradation threshold to determine whether the semiconductor chip has substantially degraded at decision block 604. The degradation threshold used in decision block 604 may substantially similar to, or the same as, the degradation threshold discussed in reference to FIG. 5. If the number of incorrect values in the third set of output values exceeds the degradation threshold, the computer system may determine that the semiconductor chip has substantially degraded at operation 606 and the method 600 may end. Otherwise, the computer system may determine that substantial degradation of the semiconductor chip has not occurred at operation 605. The computer system may then wait for a period of time (e.g., an hour, a week, or a month) and the method 600 may proceed to operation 601.

In some embodiments, rather than comparing the fourth set of output values to the third set of output values, the computer system may instead compare the fourth set of output values to the second set of output values (determined in operation 502 in FIG. 4). This may be done, for example, when the method 600 is performed to determine if incorrect values in the second set of output values were caused by transient factors (e.g., as part of decision block 505 in FIG. 5). The computer system may determine the number of incorrect values in the second set of output values by comparing the second set of output values to the fourth set of output values. The computer system may then compare the number of incorrect values in the second set of output values to the degradation threshold to determine whether the semiconductor chip has substantially degraded. In these embodiments, the computer system may not determine the third set of output values (e.g., not perform operation 601).

Figure 7:
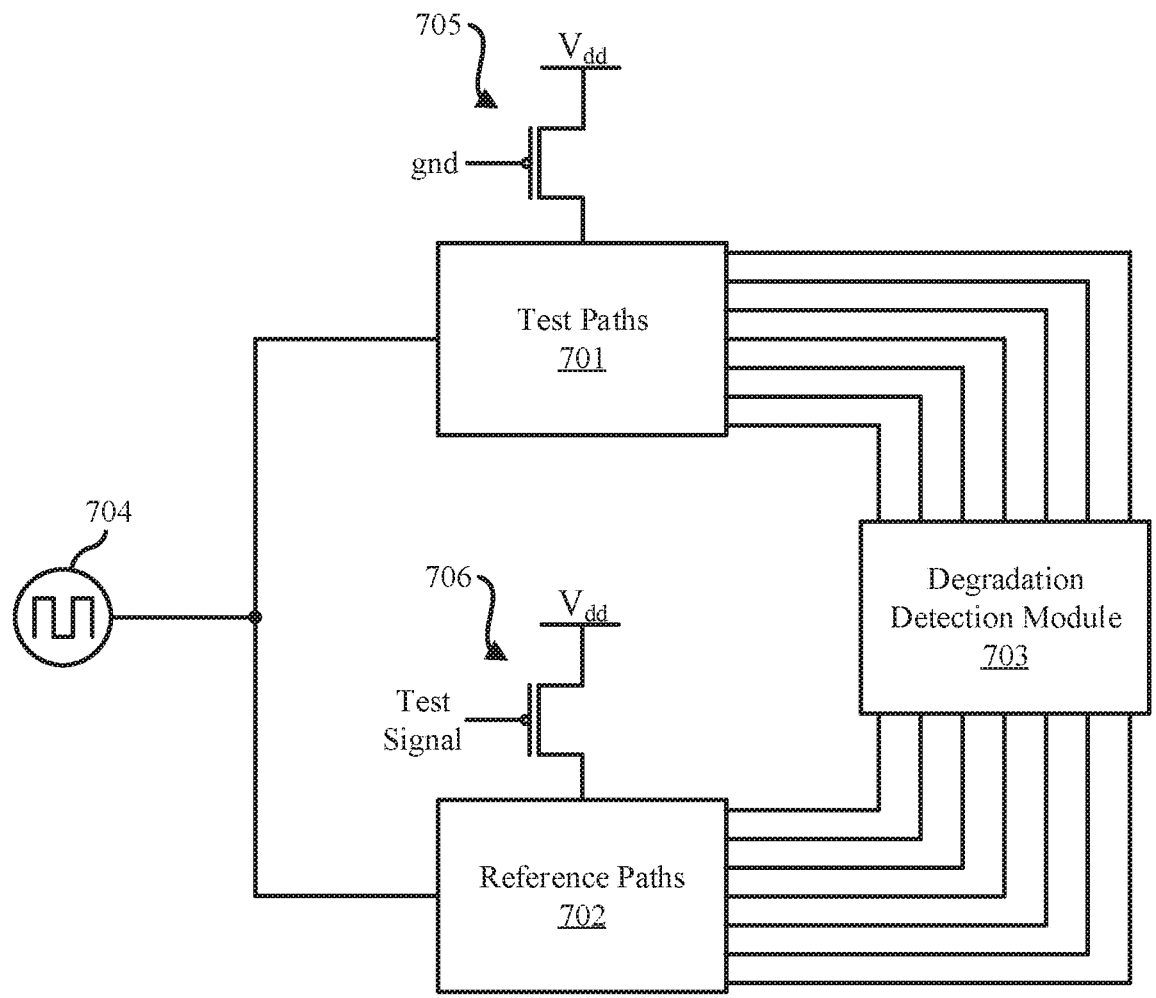
FIG. 7 illustrates a high-level block diagram of an example degradation monitoring system for a semiconductor chip, in accordance with embodiments of the present disclosure.

Referring now to FIG. 7, shown is a high-level block diagram of an example degradation monitoring system 700 for a semiconductor chip, in accordance with embodiments of the present disclosure. In some embodiments, the degradation monitoring system 700 may be physically located on the semiconductor chip (e.g., on the PCB that also include the CMOS integrated circuit whose health is being monitored). In other embodiments, the degradation monitoring system 700 may be physically located on a different computing device (e.g., on its own device) connected to the computer system. In still other embodiments, the degradation monitoring system 700 may be located in a different computer system that is communicatively coupled to, and received output values from, the computer system having the semiconductor chip.

The degradation monitoring system 700 may include a set of (i.e., one or more) test paths 701, a set of reference paths 702, and a degradation monitoring module 703. Each reference path in the set of reference paths 702 may have an associated test path in the set of test paths 701. A reference path may be considered associated with a test path if both paths include identical, or substantially similar, electronic components (e.g., logic gates, capacitors, delay circuits, etc.), and the electronic components are arranged in a substantially similar way. In some embodiments, a reference path may be associated with a test path if they have a substantially similar timing delay, even if they are not structurally similar. The reference paths 702 and test paths 701 may be connected to a system clock 704.

A first transistor 705 may be used as the switch for the test paths 701. The first transistor 705 may be a pFET transistor connected through its source to a positive supply voltage Vdd. The gate of the first transistor 705 may be connected to a ground. The sink of the first transistor may be connected to the test paths 701, providing current (from the supply voltage Vdd) to power the electronic components (e.g., the logic gates) of the test paths 701. Because the pFET 705 is connected through its gate to the ground, current may constantly flow through the test paths 701 (e.g., the test paths may always be active).

A second transistor 706 may act as a switch for the reference paths 702. The second transistor 706 may be a pFET transistor connected through its source to a positive supply voltage Vdd. The gate of the second transistor 706 may be connected to a test signal. The sink of the second transistor 706 may be connected to the reference paths 702, providing current (from the supply voltage Vdd) to power the electronic components (e.g., the logic gates) of the reference paths 702. The second transistor 706 may only allow current to flow to the reference paths 702 when the test signal is driven low. The test signal may be driven low in order to determine whether possible degradation was caused by transient factors, as discussed in reference to FIGS. 5 and 6.

The degradation detection module 703 may be configured to store the output values from the test paths 701 and the reference paths 702, as discussed herein. The degradation detection module 703 may also be configured to compare the output values from the test paths 701 to previous output values, or to output values from the reference paths 702, to determine whether the semiconductor chip has substantially degraded. The degradation detection module 703 may be configured to alert a user if degradation of the semiconductor chip has been detected.

Figure 8:
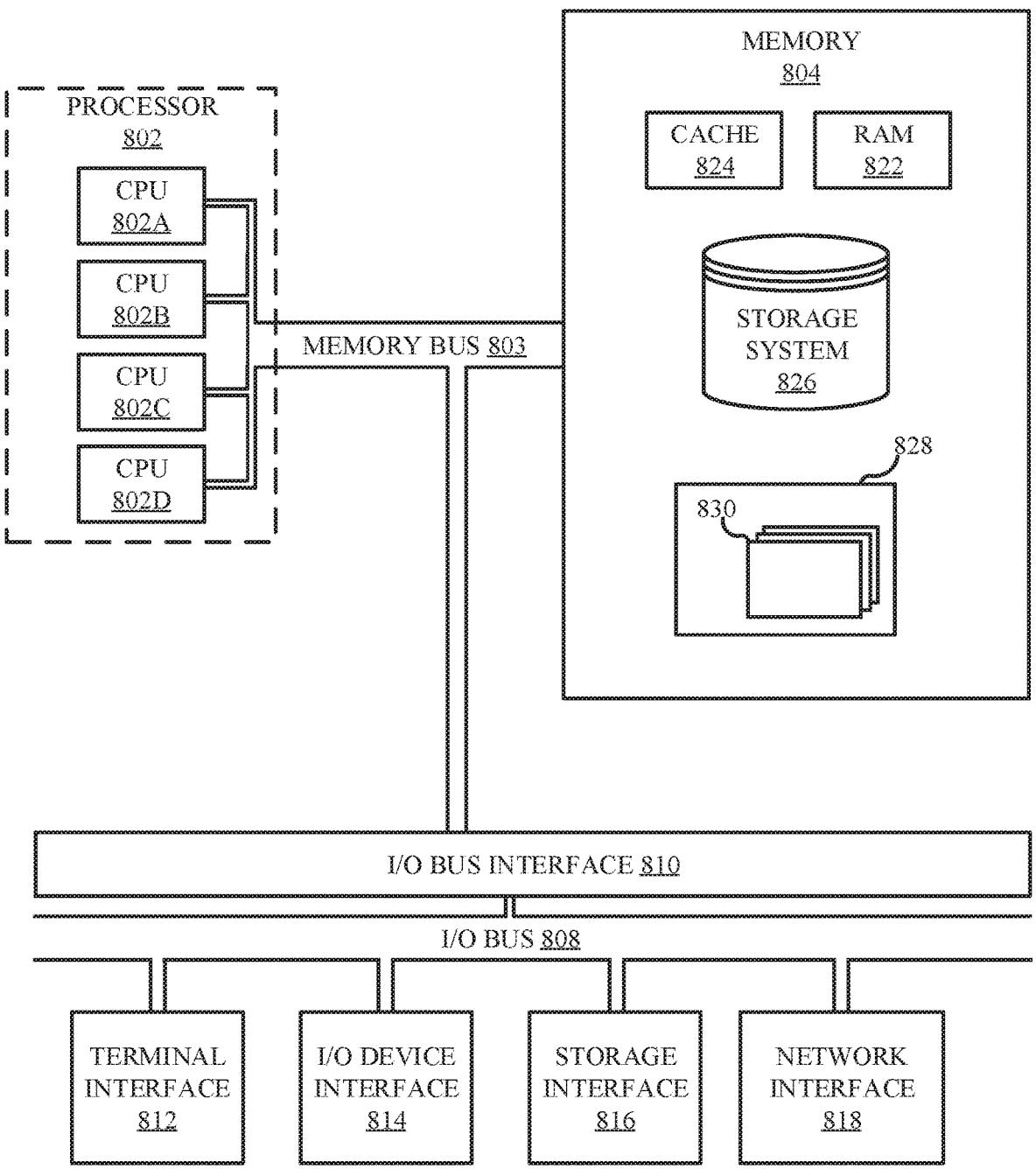
FIG. 8 illustrates a high-level block diagram of an example computer system that may be used in implementing one or more of the methods, tools, and modules, and any related functions, described herein, in accordance with embodiments of the present disclosure.

Referring now to FIG. 8, shown is a high-level block diagram of an example computer system 801 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 801 may comprise one or more CPUs 802, a memory subsystem 804, a terminal interface 812, a storage interface 816, an I/O (Input/Output) device interface 814, and a network interface 818, all of which may be communicatively coupled, directly or indirectly, for inter-component communication via a memory bus 803, an I/O bus 808, and an I/O bus interface unit 810.

The computer system 801 may contain one or more general-purpose programmable central processing units (CPUs) 802A, 802B, 802C, and 802D, herein generically referred to as the CPU 802. In some embodiments, the computer system 801 may contain multiple processors typical of a relatively large system; however, in other embodiments the computer system 801 may alternatively be a single CPU system. Each CPU 802 may execute instructions stored in the memory subsystem 804 and may include one or more levels of on-board cache.

System memory 804 may include computer system readable media in the form of volatile memory, such as random access memory (RAM) 822 or cache memory 824. Computer system 801 may further include other removable/non-removable, volatile/non-volatile computer system storage media. By way of example only, storage system 826 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 804 can include flash memory, e.g., a flash memory stick drive or a flash drive. Memory devices can be connected to memory bus 803 by one or more data media interfaces. The memory 804 may include at least one program product having a set (e.g., at least one) of program modules that are configured to carry out the functions of various embodiments.

One or more programs/utilities 828, each having at least one set of program modules 830 may be stored in memory 804. The programs/utilities 828 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 828 and/or program modules 830 generally perform the functions or methodologies of various embodiments.

Although the memory bus 803 is shown in FIG. 8 as a single bus structure providing a direct communication path among the CPUs 802, the memory subsystem 804, and the I/O bus interface 810, the memory bus 803 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 810 and the I/O bus 808 are shown as single respective units, the computer system 801 may, in some embodiments, contain multiple I/O bus interface units 810, multiple I/O buses 808, or both. Further, while multiple I/O interface units are shown, which separate the I/O bus 808 from various communications paths running to the various I/O devices, in other embodiments some or all of the I/O devices may be connected directly to one or more system I/O buses.

In some embodiments, the computer system 801 may be a multi-user mainframe computer system, a single-user system, or a server computer or similar device that has little or no direct user interface, but receives requests from other computer systems (clients). Further, in some embodiments, the computer system 801 may be implemented as a desktop computer, portable computer, laptop or notebook computer, tablet computer, pocket computer, telephone, smart phone, network switches or routers, or any other appropriate type of electronic device.

It is noted that FIG. 8 is intended to depict the representative major components of an exemplary computer system 801. In some embodiments, however, individual components may have greater or lesser complexity than as represented in FIG. 8, components other than or in addition to those shown in FIG. 8 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method comprising:
   determining a first set of output values for a set of test paths embedded on a semiconductor chip that includes a separate integrated circuit, each output value corresponding to a test path in the set of test paths, the first set of output values being determined at a first time, each test path being a path of electrically coupled logic gates,
   wherein the set of test paths includes a first test path, a second test path, and a third test path,
   wherein the first set of output values includes a first output value for the first test path, a second output value for the second test path, and a third output value for the third test path;
   determining a second set of output values for the set of test paths at a second time that is subsequent to the first time, each output value in the second set of output values having a corresponding output value in the first set of output values,
   wherein the second set of output values includes a fourth output value for the first test path, a fifth output value for the second test path, and a sixth output value for the third test path;
   comparing each value in the second set of output values to the corresponding value in the first set of output values, wherein the comparing includes:
     comparing the first output value to the fourth output value;
     comparing the second output value to the fifth output value; and
     comparing the third output value to the sixth output value;
   determining, based on the comparing, a number of incorrect values in the second set of output values, wherein a particular output value in the second set of output values is incorrect if it is different from the corresponding output value in the first set of output values; and
   determining whether degradation of the semiconductor chip has occurred by comparing the number of incorrect values to a degradation threshold, wherein the degradation threshold sets a maximum of incorrect values.

2. The method of claim 1, wherein each test path terminates in a latch, and wherein the determining the first set of output values comprises reading a value stored in each latch at the first time.

3. The method of claim 2, wherein each latch includes a clock input that is connected to a system clock, wherein the first test path includes a first latch, and wherein the determining the first set of output values comprises determining a value stored in the first latch when a rising edge of a signal generated by the system clock reaches the clock input of the first latch.

4. The method of claim 1, wherein the first set of output values are determined using circuit simulation on the set of test paths.

5. The method of claim 1, the method further comprising:
enabling, in response to determining that degradation of the semiconductor chip has occurred, a set of reference paths on the semiconductor chip, the set of reference paths being different from the set of test paths and the integrated circuit, each reference path in the set of reference paths having an associated test path in the set of test paths, each reference path being substantially similar in structure to the associated test path;
determining, in response to enabling the set of reference paths, a third set of output values for the set of reference paths at a third time;
determining a fourth set of output values for the set of test paths, the fourth set of output values being determined contemporaneous with the third time; and
determining whether one or more incorrect values in the second set of output values were caused by external factors by comparing the third set of output values to the fourth set of output values.

6. The method of claim 1, the method further comprising alerting, in response to determining that degradation of the semiconductor chip has occurred, a user of the degradation.

7. The method of claim 1, wherein each test path in the set of test paths is configured to have a different delay, wherein the delay for each respective test path is an amount of time it takes a signal to propagate through the respective test path.

8. The method of claim 1, wherein the output value for each respective test path indicates whether a signal sent into the respective test path propagated through the respective test path and was stored in a latch at the end of the respective test path within a clock cycle.

9. The method of claim 1, wherein the method further comprises calibrating the first test path to determine a delay of the first test path by:
sending a first signal through the first test path, the first signal having a first period;
determining a first test output value for the first test path based on the first signal;
sending a second signal through the first test path, the second signal having a second period;
determining a second test output value for the first test path based on the second signal; and
determining, in response to the first test output value being different than the second test output value, that the delay of the first test path is an amount of time between the first period and the second period.

10. The method of claim 1, wherein:
the degradation threshold is based on a minimum acceptable timing margin for the semiconductor chip and a granularity of the set of test paths, the granularity being a difference in delay time between the test paths.

11. The method of claim 10, wherein determining the number of incorrect values comprises:
determining a first number of values, the first number of values being values in the second set of output values that differ from corresponding values in the first set of output values;
determining a delay amount attributable to a transient factor, wherein the transient factor includes one or more selected from the group consisting of a temperature of the semiconductor chip and a supply voltage;
determining, based on the delay amount attributable to the transient factor, a second number of values that differ due to the transient factor; and
calculating the number of incorrect values by subtracting the second number of values from the first number of values.

12. The method of claim 1, wherein determining whether degradation of the semiconductor chip has occurred further comprises:
measuring a temperature of the semiconductor chip;
determining, based on the measured temperature, an increase in the delay time attributable to the temperature;
determining, based on the increase in the delay time attributable to the temperature and a granularity of the set of test paths, a number of incorrect values attributable to the increased temperature; and
reducing the number of incorrect values compared to the degradation threshold by the number of incorrect values attributable to the increased temperature.

13. A computer program product comprising a computer readable storage medium having program instructions embodied therewith, the program instructions executable by a processor to cause the processor to perform a method comprising:
determining a first set of output values for a set of test paths embedded on a semiconductor chip that includes a separate integrated circuit, each output value corresponding to a test path in the set of test paths, the first set of output values being determined at a first time, each test path being a path of electrically coupled logic gates,
wherein the set of test paths includes a first test path, a second test path, and a third test path,
wherein the first set of output values includes a first output value for the first test path, a second output value for the second test path, and a third output value for the third test path;
determining a second set of output values for the set of test paths at a second time that is subsequent to the first time, each output value in the second set of output values having a corresponding output value in the first set of output,
wherein the second set of output values includes a fourth output value for the first test path, a fifth output value for the second test path, and a sixth output value for the third test path;
comparing each value in the second set of output values to the corresponding value in the first set of output values, wherein the comparing includes:
comparing the first output value to the fourth output value;
comparing the second output value to the fifth output value; and
comparing the third output value to the sixth output value;
determining, based on the comparing, a number of incorrect values in the second set of output values, wherein a particular output value in the second set of output values is incorrect if it is different from the corresponding output value in the first set of output values; and
determining whether degradation of the semiconductor chip has occurred by comparing the number of incorrect values to a degradation threshold, wherein the degradation threshold sets a maximum of incorrect values.

14. A system comprising:
an integrated circuit for processing data embedded on a semiconductor device;
a plurality of test paths for detecting degradation of the semiconductor device, the plurality of test paths being embedded on the semiconductor device, each test path comprising one or more electrically coupled electronic components connected to a system clock at a first end and a latch at a second end, wherein the plurality of test paths includes a first test path, a second test path, and a third test path; and
processing logic configured to perform a method comprising:
determining a first set of output values for the plurality of test paths, each output value corresponding to a test path in the plurality of test paths, the first set of output values being determined at a first time,
wherein the first set of output values includes a first output value for the first test path, a second output value for the second test path, and a third output value for the third test path;
determining a second set of output values for the plurality of test paths at a second time that is subsequent to the first time, each output value in the second set of output values having a corresponding output value in the first set of output values,
wherein the second set of output values includes a fourth output value for the first test path, a fifth output value for the second test path, and a sixth output value for the third test path;
comparing each value in the second set of output values to the corresponding value in the first set of output values, wherein the comparing includes:
comparing the first output value to the fourth output value;
comparing the second output value to the fifth output value; and
comparing the third output value to the sixth output value;
determining, based on the comparing, a number of incorrect values in the second set of output values, wherein a particular output value in the second set of output values is incorrect if it is different from the corresponding output value in the first set of output values; and
determining whether degradation of the semiconductor device has occurred by comparing the number of incorrect values to a degradation threshold, wherein the degradation threshold sets a maximum of incorrect values.

15. The system of claim 14, wherein the one or more electrically coupled electronic components include one or more selected from the group consisting of a logic gate, a capacitor, and a delay circuit.

16. The system of claim 14, wherein each test path is connected to an enable signal that causes the test paths to activate when the integrated circuit is active, and wherein the enable signal further causes a switching activity of the set of test paths to mimic the switching activity of the integrated circuit.

* * * * *